(12) United States Patent
Miura

(10) Patent No.: US 6,603,205 B2
(45) Date of Patent: Aug. 5, 2003

(54) MATERIAL FOR ELECTRONIC COMPONENTS, METHOD OF CONNECTING MATERIAL FOR ELECTRONIC COMPONENTS, BALL GRID ARRAY TYPE ELECTRONIC COMPONENTS AND METHOD OF CONNECTING BALL GRID ARRAY TYPE ELECTRONIC COMPONENTS

(75) Inventor: Shigeki Miura, Osaka (JP)

(73) Assignee: FCM Co., Ltd., Osaka (JP)

( * ) Notice: Subject to any disclaimer, the term of this patent is extended or adjusted under 35 U.S.C. 154(b) by 230 days.

(21) Appl. No.: 09/729,967

(22) Filed: Dec. 6, 2000

(65) Prior Publication Data

US 2002/0071961 A1 Jun. 13, 2002

(30) Foreign Application Priority Data

Aug. 1, 2000 (JP) ........................................ 2000-233195

(51) Int. Cl.$^7$ ............................................... H01L 23/48
(52) U.S. Cl. ........................................ 257/762; 257/741
(58) Field of Search ................................ 257/734, 741, 257/750, 762

(56) References Cited

FOREIGN PATENT DOCUMENTS

| JP | 591666 | 1/1984 |
|---|---|---|
| JP | 6036692 | 2/1985 |
| JP | 6342393 | 2/1988 |
| JP | 2301546 | 12/1990 |
| JP | 2301573 | 12/1990 |
| JP | 339488 | 2/1991 |
| JP | 10326636 | 12/1998 |
| JP | 11229178 | 8/1999 |
| JP | 2000-77253 | 3/2000 |

*Primary Examiner*—Roy Potter
(74) *Attorney, Agent, or Firm*—Birch, Stewart, Kolasch & Birch, LLP.

(57) ABSTRACT

A material for an electronic component having a plating layer A formed of metals X and Y mixed with each other on a base metal material and a coating layer B formed of the metal X provided on the plating layer A is provided, whereby wettability of soldering is satisfactory ensured, degradation of solderability and appearance is prevented and generation of whiskers can also be prevented.

6 Claims, 2 Drawing Sheets

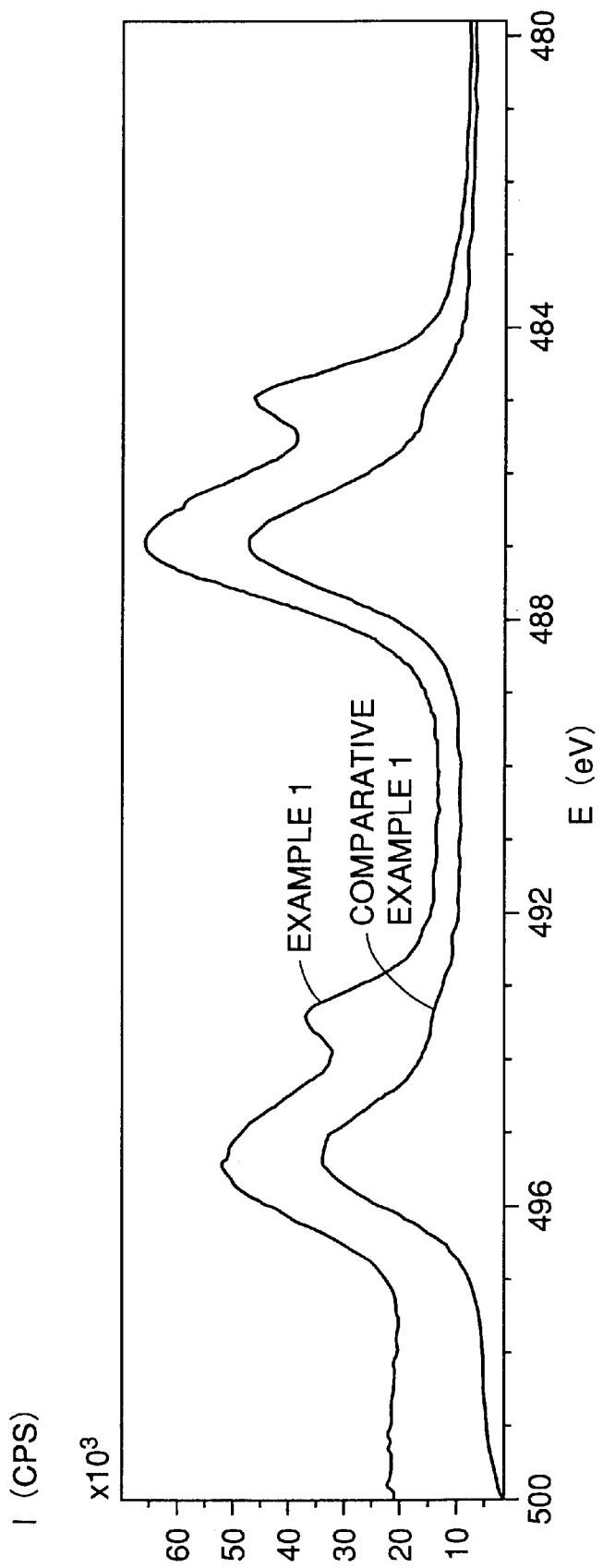

MATERIAL FOR ELECTRONIC COMPONENTS, METHOD OF CONNECTING MATERIAL FOR ELECTRONIC COMPONENTS, BALL GRID ARRAY TYPE ELECTRONIC COMPONENTS AND METHOD OF CONNECTING BALL GRID ARRAY TYPE ELECTRONIC COMPONENTS

BACKGROUND OF THE INVENTION

1. Field of the Invention

The present invention relates to materials for electronic components and, more specifically, to materials for electronic components providing connecting portions to be electrically connected to a substrate, a signal line or the like, by soldering. The present invention further relates to the method of connecting such materials for electronic components. The present invention further relates to ball grid array type electronic components and the method of connecting the ball grid array type electronic components.

2. Description of the Background Art

A contact pin, as one of the materials for the electronic components of this type is sometimes electrically connected to a signal line by soldering, in order to improve wettability (solderability) of the contact pin. When electrical connection with the signal line is to be established by soldering of the contact pin, gold plating or palladium plating is used where very severe contact resistance is required. As the gold plating or platinum plating is expensive, however, silver plating, tin plating or the like is sometimes used for the surface of the contact pin.

The tin plating mentioned above has a problem that because of aging of the plated surface, tin crystals grow, resulting in generation of needle-like or dendrite texture (hereinafter referred to as whiskers) on the surface.

When the whiskers are generated, the tin plated surface becomes very coarse, increasing contact resistance of a contact or a terminal, or electrode terminals come to be in contact with each other, degrading durability and reliability. Therefore, generation of the whiskers must be prevented.

As one of the methods to prevent generation of the whiskers, a method is known in which solder plating is used in place of the tin plating. In addition, in order to improve wettability (solderability) of the contact pin, a technique has been known, as one of the techniques of solder plating, in which a solder of tin-lead is plated on the surface of the contact pin. Lead, however, is toxic, and therefor, a contact pin that is surface-finished without using lead is desirable, because of environmental concerns.

For solder plating not using lead, various solders such as tin-silver solder and tin-zinc solder have been developed. As one of such solder platings, a technique of plating tin-copper solder on a surface of the contact pin has been known.

The tin-copper solder, however, plate finish, especially gloss finish, tends to be inferior as compared with the conventional tin-lead solder.

Further, the plating is prone to oxidation and aging while the electric or electronic components with tin-copper solder plate coatings are in storage, resulting in unsatisfactory solderability at the time of subsequent flow or reflow soldering.

Recently, electronic equipments such as portable telephones, personal computers and the like have been much reduced in size and weight while they come to have higher functions and higher performances, and such improvements are largely dependent on the reduction in size and improvement of performances of ICs. Reduction in size and improvement of functions of the ICs necessarily required increase in number and narrower pitches between input/output terminals of the IC chip. As to the manner of mounting the ICs, conventionally, dual-in line-package and quad-flat-package using lead frames have been dominant. In these methods of mounting, however, electrode arrangement is provided at a periphery of the structure, and hence electrodes can be drawn out only from the periphery of the IC. Accordingly, increase in number and narrowing of pitches of the input/output pins have been limited. In view of the foregoing, a ball grid array type electronic component has been attracting attention. According to this method of mounting, solder balls are arranged in a matrix, and therefor it is possible to draw out electrodes using a surface of the IC, which is advantageous to increase the number of input/output terminals and to reduce the size.

A solder ball as an electrode portion is sometimes formed of a tin-lead alloy. The solder ball formed of the tin-lead alloy sometimes exhibit poor wettability with the counterpart of soldering, and in that case, a relatively strong flux is used. When a relatively strong flux is used, however, electric conductivity between the solder ball and the counterpart may possibly be hindered. Accordingly, washing by a washing agent containing fron (chlorofluorocarbon), for example, becomes necessary to remove the flux. As is well known, fron is environmentally problematic.

Further, in the solder ball as electrode portion formed of a tin-lead alloy, lead is toxic, and therefor, use of lead is undesirable in view of environment. When a tin-copper alloy or a tin-silver alloy is used for the solder ball as the electrode portion, in order to avoid lead, solder wettability may be inferior to the solder ball formed of tin-lead.

SUMMARY OF THE INVENTION

An object of the present invention is to solve the above described problems, and to provide material for electronic components that maintains good solder wettability, prevents degradation in solderability and appearance, and prevents generation of whiskers. Further, the present invention provides a method of connecting a material for electronic components that enables connection of such a material for an electronic component with other components with good wettability. Further, the present invention provides a ball grid array type electronic component that enables connection of solder balls with good wettability and a method of connecting the ball grid array type electronic component.

The above described objects can be attained by the present invention in the following manner.

According to an aspect, the present invention provides a material for an electronic component, having a plating layer A formed of a metal X and a metal Y mixed with each other, on a metal material as a base material, and a coating layer B formed of the metal X, on the plating layer A.

According to another aspect of the present invention, the metal X is tin, and the metal Y is selected from a group consisting of silver, copper, zinc, bismuth and indium.

According to a still further aspect, the present invention provides a material for an electronic component having a plating layer A containing tin and at least one of silver, copper, zinc, bismuth and indium, formed on a metal material as a base material, and a coating layer B formed of tin, on the plating layer A.

According to a still further aspect, the present invention provides the material for an electronic component wherein the coating layer B has a thickness of 0.05 to 1.0 μm.

According to a still further aspect, the present invention provides a method of electrically connecting a material of an electronic component, having a plating layer A formed of a metal X and a metal Y mixed with each other, on a metal material as a base material, and a coating layer B formed of the metal X on the plating layer A, with another component, including the steps of: soldering the material for the electronic component with the solder mainly consisting of the metal X, and moving an oxide of the metal X existing at a surface of the coating layer B by the heat of soldering, to expose unoxidized metal X.

According to a still further aspect, the present invention provides a method of electrically connecting a material of an electronic component with another component, the electronic component having a plating layer A formed of a metal X and a metal Y mixed with each other, on a metal material as a base material, and a coating layer B formed of the metal X on the plating layer A, wherein the metal X is tin and the metal Y is silver, copper, zinc, bismuth or indium, the method including the steps of: soldering the material for the electronic component with the solder mainly consisting of the metal X, and moving an oxide of the metal X existing at a surface of the coating layer B by the heat of soldering, to expose unoxidized metal X.

According to a still further aspect, the present invention provides a method of electrically connecting a material for an electronic component having a plating layer A containing tin and at least one of silver, copper, zinc, bismuth and indium, formed on a metal material as a base material, and a coating layer B formed of tin, on the plating layer A, with another component, including the steps of: soldering said material for an electronic component with the solder mainly consisting of the metal X, and moving an oxide of the metal X existing at a surface of the coating layer B by the heat of soldering, to expose unoxidized metal X.

According to a still further aspect, the present invention provides a ball grid array type electronic component having a semiconductor chip mounted on a pattern on a substrate by means of solder balls, wherein the solder balls are formed of an alloy of metals X and Y and have a coating layer, covering the solder balls, formed of the metal X.

According to a still further aspect, the present invention provides ball grid array type electronic component having a semiconductor chip mounted on a pattern on a substrate and a plurality of solder balls arranged on the substrate, wherein the solder balls are formed of an alloy of metals X and Y, and have a coating layer, covering the solder balls, formed of the metal X.

According to a still further aspect, the present invention provides a ball grid array type electronic component according wherein the metal X is tin, and the metal Y is selected from the group consisting of copper, silver, bismuth and zinc According to a still further aspect, the present invention provides a ball grid array type electronic component having a semiconductor chip mounted on a pattern on a substrate by means of solder balls, wherein the solder balls are formed of an alloy containing tin and at least one of silver, copper, zinc, bismuth and indium, and have a coating layer, covering the solder balls, formed of tin.

According to a still further aspect, the present invention provides a ball grid array type electronic component wherein the coating layer has a thickness of 0.05 to 1.0 $\mu m$ According to a still further aspect, the present invention provides a method of electrically connecting a ball grid array type electronic component with other component, the ball grid array type electronic component having a semiconductor chip mounted on a pattern of a substrate by means of solder balls formed of an alloy of metals X and Y and having a coating layer, covering the solder balls, formed of the metal X, including the steps of: soldering the solder balls by a solder mainly consisting of the metal X, and moving an oxide of the metal X existing at a surface of the coating layer by the heat of soldering, to expose unoxidized metal X.

According to a still further aspect, the present invention provides a method of electrically connecting a ball grid array type electronic component with other component, the ball grid array type electronic component having a semiconductor chip mounted on a pattern on a substrate and a plurality of solder balls formed of an alloy of the metals X and Y and having a coating layer, covering the solder balls, formed of the metal X arranged on the substrate, said method including the steps of: soldering the solder balls with a solder mainly consisting of the metal X, and moving an oxide of the metal X existing at a surface of the coating layer by the heat of soldering, to expose unoxidized metal X According to a still further aspect, the present invention provides a method of electrically connecting a ball grid array type electronic component with other component, the ball grid array type electronic component having a semiconductor chip mounted on a pattern on a substrate by means of solder balls formed of an alloy containing tin and at least one of silver, copper, zinc, bismuth and indium, and having a coating layer, covering the solder balls, of tin, including the steps of: soldering the solder balls with a solder mainly consisting of the metal X, and moving an oxide of the metal X existing at a surface of the coating layer by the heat of soldering, to expose unoxidized metal X.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 illustrates peak of existence of an element or compound at a surface portion of a plating layer.

DESCRIPTION OF THE PREFERRED EMBODIMENTS

Figure 1:
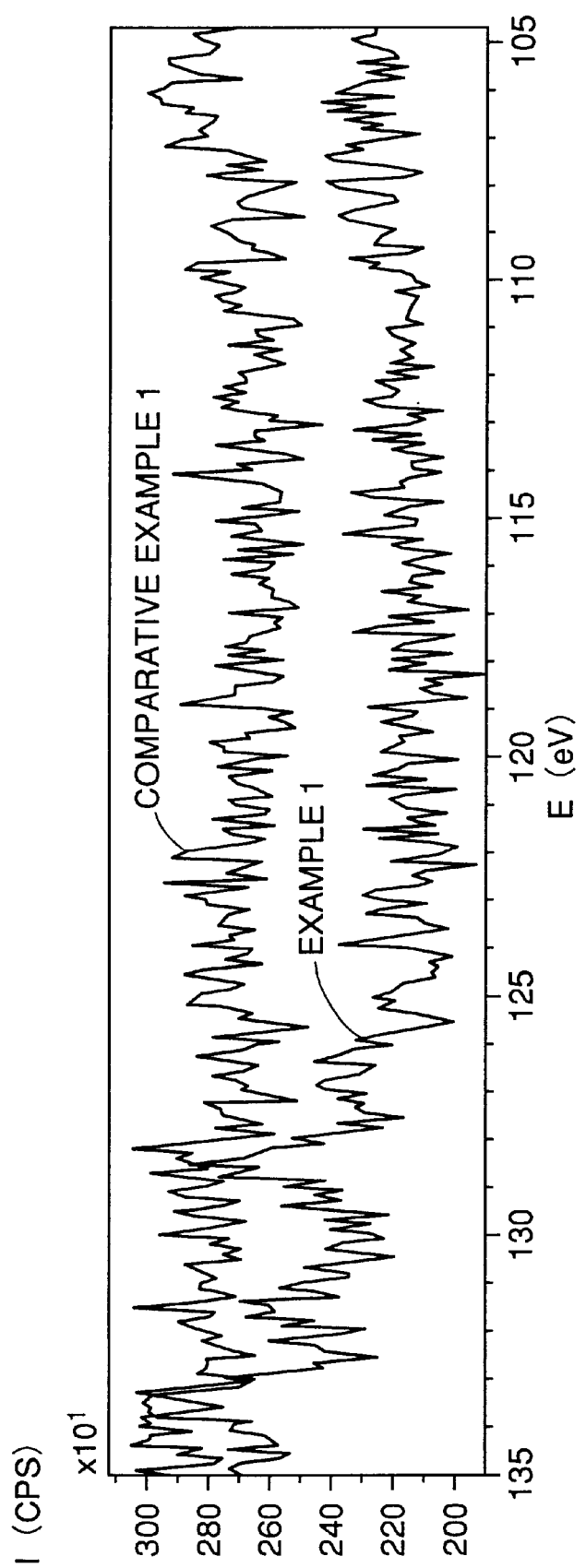
FIG. 1 shows a result of measurement of copper content peak.

The material for electronic components in accordance with the present invention has a plating layer A having metal X and metal Y existing mixedly, provided on a metal material as a base, and a coating layer B of metal X provided on the plating layer A.

By providing the plating layer A formed of metals X and Y mixed with each other on a substrate and by providing a coating layer B formed of metal X on the plating layer A, it becomes possible to prevent oxidation of metals X and Y contained in the plating layer A, and to secure existence of unoxidized metal X in the coating layer B.

Provision of a plating layer formed of metals X and Y mixed with each other on a substrate (prior art) and provision of the plating layer A formed of metals X and Y mixed with each other on a substrate and additional provision of coating layer B formed of X on the plating layer A (present invention) differ in the following points. More specifically, in the conventional plating layer, it is difficult to find existence of unoxidized metal X in the plating layer at a portion for establishing electronic connection. By contrast, in the plating layer in accordance with the present invention, unoxidized metal X can be found both in the coating layer B and the plating layer A at the portion for establishing electronic connection. Existence of the unoxidized metal X secures good solder wettability, which is the significant effect of the present invention. It goes without saying that in actual practice, when the material of the electronic component is to be electrically connected to another component, the electronic connection is established not in the state just after the finish of plating, but several days after the finish of plating.

It is of course possible that metal X contained in coating layer B reacts with oxygen contained in the air, to be an oxide of metal X. Therefore, it is natural that the oxide of metal X is contained in coating layer B. Particularly, the oxide of metal X is considered to exist at a high rate, at a surface portion of coating layer B.

When the base material is to be electrically connected to another component by soldering, however, it is possible to move the oxide of metal X existing at the surface portion of coating layer B from the portion used for electrically connection, by the heat of soldering.

More specifically, the heat of soldering acts on the coating layer B. It is considered that metal X and the oxide of metal X both exist in coating layer B, and it is expected that the oxide of metal X exists by relatively large amount at the surface portion of coating layer B. When the heat of soldering acts on the coating layer B, metal X tends to melt faster than the oxide of metal X. Where metal X has melted while the oxide of metal X has not yet melted, oxide of metal X in a solid state floats on the melt metal X. Further, where both metal X and metal Y of plating layer A have melted by the heat of soldering, the oxide metal X floats over the molten metals X and Y. It is possible to move the oxide of metal X in the floating state from the site where electrical connection is to be established, by little mechanical energy, for example by some vibration.

With the oxide of metal X moved from the site at which the electrical connection is to be established in this manner, it follows that fresh molten metal without metal oxide exists at the site where the electrical connection is to be established. Thus it becomes possible to establish electrical connection between the base material and other component with extremely high wettability.

As the metal material for the base, oxygen free copper, tough pitch copper, brass, bronze, a Cu-Fe alloy, a Cu-Be base alloy, a Cu-Ti base alloy and Cu-Ni base alloy, for example, may be used. Any material that has heat resistance higher than the melting point of solder and is conductive at least at its surface may be used as the base material. Further, the base may have linear, strip or other shape.

The plating layer A provided on the base material is a plating layer formed of metals X and Y mixed with each other. The plating layer A may be formed by a known method of plating including electroplating, hot dip plating and electroless plating. The coating layer B is formed of metal X, and provided to coat the plating layer A. The coating layer B may be formed by the known method of plating such as electroplating, hot dip plating, electroless plating, sputtering and deposition.

As the metal X, tin may be used. As the metal Y, copper, silver, bismuth or zinc may be used.

Further, the material for electronic components in accordance with the present invention may be a material having a plating layer A containing tin and at least one of silver, copper, zinc, bismuth and indium, provided on a base metal material, and a coating layer B formed of tin on the plating layer A. This structure enables further enhancement of reliability (particularly, cyclic fatigue characteristics) at the solder junction portion at the time of use and to lower to some extent the temperature for soldering at the time of mounting.

Reliability of the solder joint portion at the time of use can further be improved by providing the plating layer A containing tin, silver and copper mixed with each other, and the coating layer B formed of tin. In this case, the plating layer A may contain Sn—3.5Ag—0.75Cu. Further, by the provision of the plating layer A containing tin, silver and bismuth mixed with each other and the coating layer B formed of tin, it is possible to further improve reliability of the solder junction portion at the time of use. In that case, it is possible to provide a plating layer A of Sn—3.5Ag—6Bi.

Further, by providing a plating layer A containing tin, silver, bismuth and copper mixed with each other and a coating layer B of tin, it is possible to set relatively lower the soldering temperature at the time of mounting. In that case, it is possible to provide a plating layer A of Sn—2Ag—3Bi—075Cu, and the soldering temperature at the time of mounting can be set to about 230° C. Further, it is possible to provide the plating layer A of Sn—3Ag—5Bi—0.7Cu, and the soldering temperature at the time of mounting can be set to about 230° C.

The thickness of the coating layer B can be set to 0.05 to 1.0 $\mu$m.

When the thickness of coating layer B is smaller than 0.05 $\mu$m, it is insufficient as the thickness of a coating. When oxidation proceeds extremely, the plating layer A would possibly be oxidized. If the thickness of the coating layer B exceeds 1.0 $\mu$m, generation of whiskers at the surface portion is possible, when tin is used as the metal X, for example.

The thickness of the plating layer A may be several to several tens $\mu$m. More specifically, the thickness may differ dependent on the type of the metal use as the base or on the use of the plating. Generally, the thickness of 1 $\mu$m to 50 $\mu$m is possible.

The thickness of the plating layer A is not limited to the range of 1 $\mu$m to 50 $\mu$m and, what is important is that the relation between the thickness of plating layer A and the thickness of coating layer B satisfy the relation of thickness of plating layer A>>thickness of coating layer B. In other words, the setting satisfying the following relation is possible:

(thickness of plating layer A)/(thickness of coating layer B)=0.001 to 1.

By soldering the material for the electronic components in accordance with the present invention, with the solder mainly consisting of metal X, and by moving an oxide of metal X existing on the surface of coating layer B by the heat of soldering, it is possible to expose unoxidized metal X and to perform soldering with superior wettability.

On the surface of the coating layer B, it is considered that an oxide of metal X exists, which oxide of metal X deteriorates wettability of solder, preventing satisfactory soldering. In accordance with the method of connection of the material for electronic components in accordance with the present invention, it is possible to move the oxide of metal X which is considered to exist near the surface of coating layer B from the site where electronic connection is to be established, when heated for soldering. More specifically, when heated for soldering, the metals X and Y constituting the plating layer A and the metal X existing in the coating layer B melt, whereas the oxide of metal X, which is believed to exist near the surface of coating layer B, is still in a solid state. Therefore, when the heat of soldering is applied, the oxide of metal X comes to float on the molten metal, and hence the oxide can be easily moved from the portion where electronic connection is to be established. At the time of electrical connection, there is no oxide of metal X existing at the portion, and only the fresh metal will be involved. Thus, soldering with extremely high wettability is possible. As the metal X, tin may be used and, as the metal Y, copper, silver, bismuth, indium or zinc may be used.

In a ball grid array type electronic component having a semiconductor chip mounted on a pattern on a substrate by means of solder balls, by forming the solder ball with an alloy of metals X and Y and by providing a coating layer of metal X, it becomes possible to establish electronic connection between the substrate and the semiconductor chip while maintaining wettability of the solder balls. More specifically, the solder balls formed of an alloy of metals X and Y and having a coating layer of metal X are soldered, with the solder mainly consisting of metal X. Then, by the heat of soldering, an oxide of metal X existing at a surface of the coating layer moves, exposing unoxidized metal X. Accordingly, electrical connection between the substrate and the semiconductor chip becomes possible while maintaining wettability of the solder balls. By connecting and arranging solder balls having the coating layer on the substrate in advance and performing soldering with the solder mainly consisting of metal X, it becomes possible to establish electrical connection between the substrate and the semiconductor chip while maintaining wettability of the solder balls.

Further, by connecting and arranging solder balls having the coating layer on the semiconductor chip in advance and performing soldering with the solder mainly consisting of metal X, it becomes possible to establish electronic connection between the substrate and the semiconductor chip while maintaining the wettability of the solder balls.

By connecting and arranging solder balls having the coating layer on the semiconductor chip in advance, connecting and arranging solder balls having the coating layer on the substrate in advance, and performing soldering with the solder mainly consisting of metal X, it becomes possible to establish electrical connection between the substrate and the semiconductor chip by connecting the solder balls connected and arranged on the semiconductor chip and the solder balls connected and arranged on the substrate, while maintaining wettability.

In a ball grid array type electronic component having solder balls formed of an alloy of metals X and Y, by providing a coating layer of metal X on the solder balls, performing soldering with the solder mainly consisting of metal X and moving an oxide of metal X existing at a surface of the coating layer by the heat of soldering, unoxidized metal X is exposed and it becomes possible to connect the ball grid array type electronic components while maintaining wettability of the solder balls.

It is considered that metal X and the oxide of metal X both exist in coating layer B, and it is expected that the oxide of metal X exists by a relatively large amount at the surface portion of coating layer. When the heat of soldering acts on the coating layer, metal X tends to melt faster than the oxide of metal X. Where metal X has melted while the oxide of metal X has not yet melted, oxide of metal X in a solid state floats on the molten metal X. It is possible to move the oxide of metal X in the floating state from the site where electrical connection is to be established, by little mechanical energy, for example by some vibration. With the oxide of metal X moved from the site at which the electrical connection is to be established in this manner, it follows that fresh molten metal without metal oxide exists at the site where the electrical connection is to be established. Thus it becomes possible to establish electrical connection of the ball grid array type electronic component with extremely high wettability.

The metal X may be tin, and the metal Y may be copper, silver, bismuth or zinc.

The ball grid array type electronic component in accordance with the present invention having a semiconductor chip mounted on a pattern on a substrate by means of solder balls, the solder ball contains tin and at least one of silver, copper, zinc, bismuth and indium, and has a coating layer, covering the solder balls, formed of tin.

Reliability of the solder junction portion at the time of use can further be improved by providing the solder balls containing tin, silver and copper mixed with each other, and the coating layer formed of tin. In this case, the solder balls may contain Sn—3.5Ag—0.75Cu. Further, by the provision of the solder balls containing tin, silver and bismuth mixed with each other and the coating layer formed of tin, it is possible to further improve reliability of the solder junction portion at the time of use. In that case, it is possible to provide the solder balls of Sn—3.5Ag—6Bi.

Further, by providing solder balls containing tin, silver, bismuth and copper mixed with each other and a coating layer, covering the solder balls, of tin, it is possible to set relatively lower the soldering temperature at the time of mounting. In that case, it is possible to provide the solder balls of Sn—2Ag—3Bi—0.75Cu, and the soldering temperature at the time of mounting can be set to about 230° C. Further, it is possible to provide the solder balls of Sn—3Ag—5Bi—0.7Cu, and the soldering temperature at the time of mounting can be set to about 230° C.

The coating layer may have the thickness of 0.05 to 1.0 $\mu$m. When the thickness of the coating layer is smaller than 0.05 $\mu$m, it is too thin as the coating layer and if oxidization proceeds extremely, it becomes difficult to ensure existence of unoxidized metal X in the coating layer. When the thickness of the coating layer exceeds 1.0 $\mu$m, it is possible that whiskers are generated on the surface portion, when tin is used as the metal X, for example.

By soldering the solder balls of the ball grid array type electronic component in accordance with the present invention with the solder mainly consisting of metal X and moving an oxide of metal X existing at the surface of the coating layer by the heat of soldering, it is possible to expose unoxidized metal X and to perform soldering with extremely high wettability.

It is possible to provide the plating layer A after providing an undercoat plating on the material for the electronic component. As the undercoat plating, copper plating or nickel plating may be performed to provide an undercoat plating layer. Sulfuric acid bath, pyrophosphoric acid bath, fluoroboric acid bath, sulfamic acid bath, cyaniding bath or the like may be used as the plating solution. The plating solution may contain, as a brightener, an organic sulfer compound such as thiocarbonyl, polysulfide or the like, the plating solution may contain, as smoothing component, phenazine, triethanolamine, azine, gelatin, starch, dextrin or the like, and the plating solution may contain, as a dispersing component, an ninionic surface active agent such as polyether or an anionic surface active agent such as ester sulfate. As to the acid component contained in the plating bath to provide the plating layer A or coating layer B, one or more organic sulfonic acid selected from the group consisting of substituted or unsubstituted alkane sulfonic acid, benzene sulfonic acid and napthalene sulfonic acid may be used. Specifically, the organic sulfonic acid that can be used include, for example, methane sulfonic acid, ethane sulfonic acid, propane sulfonic acid, 2-propane sulfonic acid, butane sulfonic acid, 2-butane sulfonic acid, pentane sulfonic acid, chlorpropane sulfonic acid, 2-hydroxyethane-1-sulfonic acid, 2-hydroxypropane-1-sulfonic acid, 2-hydroxybutane-1-sulfonic acid, 2-hydroxypentane-1-sulfonic acid, allyl sulfonic acid, 2-sulfon acetic acid, 2-sulfo propionic acid, 3-sulfo propionic acid, sulfo succinic acid, sulfo maleic acid, sulfo fumaric acid, benzene sulfonic acid, toluene sulfonic acid, xylene sulfonic acid, nitrobenzene sulfonic acid, sulfobenzonid acid, sulfosalicylic acid, benzaldehyde sulfonic acid and p-phenol sulfonic acid.

The material for electronic components may be applicable to a lead frame for a semiconductor electronic component, an electrode terminal for a semiconductor chip, an electrode terminal pin for an inserting type semiconductor component, a circuit board electrode having an electronic or electric circuitry, a circuit board through hole having an electronic or electric circuitry, a photo semiconductor device such as an optical fiber or an optical preamplifier, and a photo semiconductor module package having an electronic semiconductor device.

Therefore, the method of connecting the material for electronic component in accordance with the present invention can be implemented at such terminal portions as follows: connection terminal portions between a display component such as a liquid crystal display, plasma, EL (Electro Luminescence), and fluorescent character display tube of various information terminals including personal telephones and PDAs (Personal Digital Assistants: electronic organizer having the function of calculation, communication and the like) and an electric or electronic circuit board driving the same; terminal portions of a connector portion connecting a power supply to such an information terminal with an electric or electronic circuit board; electrode terminal portions of electric or electronic circuit boards used in general information terminals such as personal computers, printers, facsimiles, electronic cameras, DVDs, in addition to these information terminals, home use appliances such as televisions, refrigerators and washing machines, and various electronic devices such as general purpose cameras, electronic cameras and devices mounted on automobiles, such as current navigation systems; junction portions of various mounting substrates used for the above described applications, particularly the junction portions between in-layer and interlayer connecting through hole plating portions and electrode pads formed directly thereabove in high density, high precision multilayer substrate; and connection terminal portions of optical semiconductor devices such as optical fibers or optical preamplifiers, and a container component (generally referred to as optical packages) referred to as a can, containing an electronic semiconductor device. It is noted that Au plating is generally used in view of high reliability and wash-free joint, for soldering of connection terminal portions of the so called optical packages. In order to meet the explosively increasing demand to implement rapidly developing infrastructures such as communication networks related to information technology, significant reduction of cost has been required. Accordingly, Sn/Ag base solder plating has come to be used as an inexpensive plating, replacing the Au plating. Further, solder plating with good solder performance enabling wash-free joint is also required. Further, hermetic sealing solder plating satisfying similar requirements has been desired, so as to ensure gas tight sealing of the packages. Therefore, the material for electronic components and the method of connection of the material for electronic components in accordance with the present invention may be suitably applied to such fields.

In various semiconductor package components used in portable information terminals such as portable telephones, PDAs, digital cameras, portable game machines and the like, which are required to be compact, light, thin and to have high function, high speed of operation (high frequency) and large capacity (memories), junction between a semiconductor chip and a circuit board contained in the package has come to be established by solder bumps, referred to as a ball grid array, rather than the conventional wire bonding. Further, the solder bumps referred to as the ball grid array is also used for electrical junction between the circuit board within the package and an electric or electronic circuit board mounted on the side of the equipment (generally referred to as a mother board). The ball grid array in accordance with the present invention can be used as such a ball grid array.

Not only among the above described portable information terminals but also other devices, generally, information has been transmitted/received by such a medium as electric wire cable or wireless communication. In addition to these existing methods, a semiconductor memory card has come to be used as a third medium, in which information distributed to various information terminals is directly input and stored and which is carried and used as the storage medium. A memory card using a data storing type flash memory is used therefor. Different from general purpose semiconductor package components, the semiconductor components used for the memory card all have the ball grid array type packages. As it is necessary to make thin and compact, the package size must be approximately the same as the size of the semiconductor chip used therefor. Accordingly, a package which is generally called a CSP (Chip Size Package) is sometimes used, or, alternatively, a semiconductor chip is used as it is (that is, not in a package formed but as a bare chip. This is referred to as bare chip mounting). No matter what form is used, solder balls or solder banks are used at the electric contacts, and the solder balls and the solder bumps may be formed by the alloy of metals X and Y with a coating of metal X. By using tin as the metal X and by using copper, silver, bismuth or zinc as the metal Y, it is possible to realize lead-free and wash-free mounting method, and to realize the method of forming solder balls and the solder bumps with superior solderability.

Further, the present invention can be implemented not dependent on the shape or type of the object electronic components. More specifically, the present invention can appropriately be applied to insertion type components, surface mounting components of lead frame type as well as ball grid type components utilizing solder balls.

According to the structure of the present invention, a material for electronic components that can quite successively ensure wettability or soldering is provided. Further, according to the present invention, solderability and appearance are not degraded, while generation of whiskers can be prevented. Further, by the connecting structure of the material for electronic components in accordance with the present invention, soldering with superior wettability with other component is possible. Various components including substrates and signal lines may be used as other components, and hence the present invention provides inestimable advantages. Further, by the structure of the present invention, it is possible to connect a ball grid array with satisfactory wettability. Further, as it is unnecessary to positively use a flux, the present invention also solves the environmental problem.

The present invention will be described with reference to specific examples in the following.

EXAMPLE 1

A member for an electronic component was subjected to cathode degreasing and anode degreasing by using a degreasing agent such as Endox 114 (trade name of Japan Metal Finishing Company Ltd.), washed by water, subjected to acid pickling by $H_2SO_4.HCl.HBF_4$, and washed again by water. Thereafter, as an undercoat plating, copper plating or nickel plating was performed, providing an undercoat plating layer.

After the undercoat plating is activated, a plating layer A was provided on the undercoat plating. As the plating layer A, tin-copper solder plating was used. The plating bath included acid component having the concentration of 0.9N to 1.4N and the average concentration of 1.28N, tin component within the range of 40 g/l to 60 g/l and average concentration of 51 g/l, copper component within the range of 0.5 g/l to 5 g/l and having the average concentration of 1.1 g/l, and an additive within the range of 40 cc/l to 60 cc/l and having the average concentration of 50 cc/l. The additive contained a brightener component, a smoothing component and a dispersing component. Specific components are as described above. The temperature condition was from 25° C. to 33° C., with the average temperature of 28° C. The current density was within the range of 4 A/dm$^3$ to 20 A/dm$^3$, with the average current density being 10 A/dm$^3$. A 100% tin electrode was used as the anode electrode.

After the provision of plating layer A, a coating layer B was formed on the plating layer A. The coating layer B was provided by tin plating. The plating bath contained an acid component within the range of 0.9N to 1.4N and having the average concentration of 1.1N, a tin component within the range of 40 g/l to 65 g/l and having the average concentration of 55 g/l, and an additive within the range of 10 cc/l to 30 cc/l and having the average concentration of 20 cc/l. The additive contained a brightener, a smoothing component and a dispersing component. Specific components are as described above. The temperature condition was from 20° C. to 30° C., with the average temperature being 29° C. The current density was within the range of 1 A/dm$^3$ to 20 A/dm$^3$, with the average current density being 4 A/dm$^3$. A tin electrode plate was used as the anode electrode.

After the coating layer B was provided by tin plating, phosphate treatment was performed and the resulting structure was dried. The thickness of the tin-copper solder plating layer as the plating layer A was 3.21 μm. Copper content of the tin-copper solder plating layer was 1.5 wt. %. The thickness of the tin plating layer as the coating layer B was 0.5 μm. Therefore, in Example 1, the total thickness of plating layer A and coating layer B was 3.71 μm. The result is as shown in Table 1. The plating thickness was measured by the Fluorescent X-ray Coating Thickness Gage. The copper content in the plating layer was measured by EPMA.

EXAMPLE 2

By the similar method as in Example 1 described above, the plating layer A and a coating layer B were provided on the undercoat plating. The thickness of the tin-copper solder plating as the plating layer A was 4.22 μm. The copper content of the tin-copper solder plating layer was 6.1 wt. %. The thickness of the tin plating as the coating layer B was 0.7 μm. Therefore, the total thickness of the plating layer A and a coating layer B in Example 2 was 4.92 μm. The result is as shown in Table 1.

Comparative Example 1

A material for an electronic component was subjected to cathode degreasing and anode degreasing by using a degreasing agent such as Endox 114, washed by water, subjected to acid pickling by $H_2SO_4.HCl.HBF_4$, washed again by water, and a copper plating was provided as an undercoat plating, thus an undercoat plating layer was provided.

The undercoat plating was activated and, thereafter, a tin-copper solder plating was performed on the undercoat plating, thus a tin-copper plating layer was provided. The tin-copper plating layer corresponds to the plating layer A of the present invention. The plating bath contained an acid component within the range of 0.9N to 1.4N and having the average concentration of 1.28N, a tin component within the range of 40 g/l to 60 g/l and having the average concentration of 51 g/l, a copper component within the range of 0.5 g/l to 5 g/l and the average concentration of 1.1 g/l, and an additive within the range of 40 cc/l to 60 cc/l and having the average concentration of 50 cc/l. The additive contained a brightener, a smoothing component and a dispersing component. Specific components are as described above. The temperature condition was from 25° C. to 33° C., with the average temperature being 28° C. The current density was within the range of 4 A/dm$^3$ to 20 A/dm$^3$, with the average current density being 10 A/dm$^3$. A 100% tin electrode was used as the anode electrode, After the tin-copper plating layer was provided, the resulting structure was subjected to phosphate treatment, and dried. The thickness of the tin-copper plating layer was 3.51 μm. The copper content of the tin-copper plating layer was 1.5 wt. %. The result is as shown in Table 1.

Comparative Example 2

By the similar method as in Comparative Example 1 described above, a tin-copper plating layer was provided on the undercoat plating layer. The thickness of the tin-copper plating layer was 4.12 μm. Copper content of the tin-copper plating layer was 6.1 wt. %. The result is as shown in Table 1.

TABLE 1

| | Sn-Cu layer | | Sn layer | |
| --- | --- | --- | --- | --- |
| | plating thickness (μm) | Cu content (%) | plating thickness (μm) | total thickness (μm) |
| Example 1 | 3.21 | 1.5 | 0.5 | 3.71 |
| Example 2 | 4.22 | 6.1 | 0.7 | 4.92 |
| Comparative Example 1 | 3.51 | 1.5 | | 3.51 |
| Comparative Example 2 | 4.12 | 6.1 | | 4.12 |

Surface Analysis Test

A surface analysis test was performed on the plating layers in accordance with Example 1 and Comparative Example 1. The state immediately after the provision of the plating layer is referred to as the plate finished state, while a state after the provided plating layers were heated for four hours at 150° C. is referred to as an oxidized state. In the following, surface analysis test performed on the platings in the oxidized state will be described. FIG. 1 shows a result of measurement of copper content at the surface of the plating layers in accordance with Example 1 and Comparative Example 1, respectively. More specifically, for Example 1, copper content at the surface portion of coating layer B was tested, and for Comparative Example 1, copper content at the surface portion of tin-copper plating layer was tested. For the surface analysis test: Eska (Axis Ultra of KRATOS ANALYTICAL Ltd.) was used. The result of the surface analysis test is as shown in FIG. 1. In FIG. 1, the abscissa represents atomic bonding energy, while the ordinate represents strength of respective bonding energies. It is clear from FIG. 1 that from the result of analysis, copper content of Example 1 is extremely smaller than the copper content of Comparative Example 1. The reason for this is that, different from Comparative Example 1, the coating layer B, that is a tin plating layer, is provided in Example 1.

Thereafter, using Eska (Axis Ultra of KRATOS ANALYTICAL Ltd.) in the similar manner, existence ratio of elements or components at the surface of plating layers in accordance with Example 1 and Comparative Example 1, respectively, were measured. More specifically, for Example 1, ratio of existence of elements or components was measured at the surface portion of coating layer B, and for Comparative Example 1, the ratio of existence of elements or components at the surface portion of tin-copper plating layer was measured. The result of measurements is as shown in FIG. 2.

The peak at 487 eV represents existence of tin oxide. The peak at 487 eV in Example 1 is higher than that in Comparative Example 1. The reason for this is that tin oxide exists by larger amount in Example 1, as the coating layer B of Example 1 is a tin plating layer, while the plating layer of Comparative Example 1 is a tin-copper plating layer.

The peak at 485 eV represents existence of tin (unoxidized tin). In Example 1, the peak at 485 eV is observed, while it is not observed in Comparative Example 1. The reason for this is that the coating layer B in accordance with Example 1 contains tin oxide existing at the surface portion, and tin (unoxidized tin) existing at the same surface portion, and the tin existing at the surface portion is detected. In Comparative Example 1, the peak, representing existence of the unoxidized tin, is not detected.

In Example 1, there exists tin oxide as in the Comparative Example 1, at the surface portion of coating layer B, while there is additionally the unoxidized tin, which cannot be observed in the Comparative Example. An unoxidized tin that is not observed in the Comparative Example locally melts by the heat of soldering at the time of electrical connection with other component, whereby the oxidized tin floats and moves, exposing unoxidized tin of plating layer A. Accordingly, soldering with satisfactory wettability is possible. Comparative Example 1, it is difficult to find a peak indicative of the existence of unoxidized tin, and therefore it is expected that soldering with good wettability is difficult.

Solder Wetting Test

Solder wettability was evaluated by measuring zero-cross time, of the plating layers in accordance with Example 1, Example 2, Comparative Example 1 and Comparative Example 2. The zero-cross time represents the time until wetting. The shorter the zero-cross time, the better wettability the solder exhibits. Longer zero-cross time represents unsatisfactory solder wettability. The zero-cross time of 5.0 seconds or longer represents that wettability is quite unsatisfactory.

The state immediately after the provision of the plating layer is referred to as the plate finished state, and the state after the provided plating layer was heated for four hours at 150° C. is referred to as an oxidized state. The plating layers in accordance with Example 1, Example 2, Comparative Example 1 and Comparative Example 2 were subjected to zero-cross time measurement, in the plate finished state and oxidized state, respectively. The zero-cross time was measured by using the digital solder graph of TAMURA KAKEN, CO., LTD. The measurement temperature was 230° C. The soldering was done with tin-lead eutectic, with the weight ratio of tin and lead being 6:4. As the solder wettability evaluation test, zero-cross time was measured in the plate finished state and in the oxidized state with flux and without flux. As the flux, 25 wt. % of rosin diluted by isopropyl alcohol was used.

As a sample, a comb type connector pin formed of brass was used. As the undercoat plating, the comb type connector pin was subjected to copper plating having the thickness of about 1.5 to about 2.5 $\mu$m. The comb type connector pin included a comb base portion of approximately linear shape, and a comb teeth portion having a plurality of teeth arranged parallel to each other, on the base portion. Each tooth had a wide, thin approximately rectangular portion, and a narrow, thin approximately rectangular portion provided attached to the shorter side of the wide portion. The wide portion and the narrow portion had the thickness of 0.2 mm. The longitudinal length of the comb base portion was 75 mm. The longer side of the wide portion was 8.5 mm and the shorter side was 0.7 mm. The shorter side of the narrow portion was 0.4 mm. The area of the wide portion was 0.05 cm$^2$. When the zero-cross time is measured, the comb portion is used detached from the comb base portion. The result of measurement of the zero-cross time of the plating layers formed in accordance with Example 1, Example 2, Comparative Example 1 and Comparative Example 2 is as shown in Table 2.

TABLE 2

|  | plate finished state | | after oxidation (150° C., 4 hours) | |
| --- | --- | --- | --- | --- |
|  | without flux | with flux | without flux | with flux |
| Example 1 | 4.7 | 1.4 | 5.0 or longer | 2.3 |
| Example 2 | 4.2 | 1.6 | 5.0 or longer | 2.3 |
| Comparative Example 1 | 5.0 or longer | 1.7 | 5.0 or longer | 3.4 |
| Comparative Example 2 | 5.0 or longer | 2.2 | 5.0 or longer | 4.2 |

(unit: sec.)

First, the plate finished state, that is, the state when the plating layer was formed, will be discussed. No matter whether the flux is used or not, it is understood that the plating layer in accordance with the present invention has the zero-cross time significantly reduced as compared with the plating layers of the Comparative Examples. This means that the plating layers in accordance with the present invention have far better wettability than the Comparative Examples.

The state after oxidation, that is, when the plating layers were intentionally oxidized, will be discussed. When the flux was not used, the plating layers in accordance with the present invention and the plating layers of the Comparative Examples both have the zero-cross time of 5.0 or longer, indicating extremely unsatisfactory wettability. When the flux is used, however, the plating layers in accordance with the present invention have the zero-cross time made shorter than the plating layers of the Comparative Examples. Namely, the plating layers in accordance with the present invention have better wettability than the Comparative Examples.

Though tin was used as the metal X and copper was used as the metal Y in the embodiment above, the effect of the present invention is not limited to this combination.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A material for an electronic component, having a plating layer A formed of a metal X and a metal Y mixed with each other, on a metal material as a base material; and a coating layer B formed of the metal X, on said plating layer A, wherein said metal X is tin, and said metal Y is a mixture of silver and copper.

2. A material for an electronic component, having a plating layer A formed of a metal X and a metal Y mixed with each other, on a metal material as a base material; and a coating layer B formed of the metal X, on said plating layer A, wherein said metal X is tin, and said metal Y is a mixture of silver and bismuth.

3. A material for an electronic component, having a plating layer A formed of a metal X and a metal Y mixed with each other, on a metal material as a base material; and a coating layer B formed of the metal X, on said plating layer A, wherein said metal X is tin, and said metal Y is a mixture of silver, bismuth, and copper.

4. A material for an electronic component, having a plating layer A formed of a metal X and a metal Y mixed with each other, on a metal material as a base material; and a coating layer B formed of the metal X, on said plating layer A, wherein said metal X is tin, and said metal Y contains at least one of zinc, bismuth and indium.

5. A material for an electronic component, having a plating layer A formed of a metal X and a metal Y mixed with each other, on a metal material as a base material; and a coating layer B formed of the metal X, on said plating layer A, wherein said metal X is tin, said metal Y contains at least one of silver, zinc, bismuth and indium, and said coating layer B has a thickness of equal to or more than 0.05 $\mu$m and equal to or less than 1.0 $\mu$m.

6. The material for an electronic component according to any of claims 1–4, wherein said coating layer B has a thickness of 0.05 $\mu$m to 1.0 $\mu$m.

* * * * *